United States Patent
Axness et al.

(10) Patent No.: US 7,162,218 B2
(45) Date of Patent: Jan. 9, 2007

(54) SYSTEM AND METHOD FOR A DIRECT CONVERSION MULTI-CARRIER PROCESSOR

(75) Inventors: Timothy A. Axness, Collegeville, PA (US); Leonid Kazakevich, Plainview, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 336 days.

(21) Appl. No.: 10/456,300

(22) Filed: Jun. 6, 2003

(65) Prior Publication Data

US 2004/0072547 A1 Apr. 15, 2004

Related U.S. Application Data

(60) Provisional application No. 60/387,207, filed on Jun. 7, 2002.

(51) Int. Cl.
*H04B 1/26* (2006.01)
*H04B 1/38* (2006.01)

(52) U.S. Cl. ............... 455/324; 455/234.2; 455/226.1; 455/245.2; 375/222

(58) Field of Classification Search ............... 455/324, 455/323, 234.2, 226.1, 245.2, 126, 142, 103, 455/266; 375/222, 347, 295
See application file for complete search history.

(56) References Cited

U.S. PATENT DOCUMENTS

| | | | | |
|---|---|---|---|---|
| 5,483,691 A | * | 1/1996 | Heck et al. | ............... 455/234.2 |
| 5,564,076 A | * | 10/1996 | Auvray | ........................ 455/103 |
| 5,818,883 A | * | 10/1998 | Smith et al. | .............. 455/226.1 |
| 5,898,912 A | * | 4/1999 | Heck et al. | ............... 455/234.2 |
| 5,999,578 A | | 12/1999 | Ha | |
| 6,009,130 A | * | 12/1999 | Lurey et al. | ................. 455/313 |
| 6,167,099 A | * | 12/2000 | Rader et al. | ................. 375/222 |
| 6,351,500 B1 | | 2/2002 | Kumar | |
| 6,480,528 B1 | | 11/2002 | Patel et al. | |
| 6,606,484 B1 | * | 8/2003 | Faulkner | ...................... 455/324 |
| 6,611,565 B1 | | 8/2003 | Bada et al. | |
| 6,631,170 B1 | | 10/2003 | Gu | |
| 6,775,336 B1 | * | 8/2004 | Takaki | ...................... 455/245.2 |
| 6,819,910 B1 | * | 11/2004 | Shi et al. | ..................... 455/126 |
| 2002/0051503 A1 | * | 5/2002 | Takahiko | ..................... 375/324 |
| 2002/0150169 A1 | * | 10/2002 | Kishi | .......................... 375/295 |
| 2002/0154687 A1 | * | 10/2002 | Bierly et al. | ................. 375/222 |

FOREIGN PATENT DOCUMENTS

| | | |
|---|---|---|
| EP | 0 681 382 | 11/1995 |
| WO | 99/14863 | 3/1999 |
| WO | 02/29968 | 4/2002 |

* cited by examiner

*Primary Examiner*—Lana Le
(74) *Attorney, Agent, or Firm*—Volpe and Koenig, P.C.

(57) ABSTRACT

A radio communications device such as a receiver, transmitter or transceiver provides direct conversion of quadrature signals between a radio frequency signal and a plurality of resolved channels. The device provides block processing of multiple RF carriers in a wireless communication system using a direct conversion transmitter/receiver and baseband signal processing.

12 Claims, 2 Drawing Sheets

SYSTEM AND METHOD FOR A DIRECT CONVERSION MULTI-CARRIER PROCESSOR

CROSS REFERENCE TO RELATED APPLICATION(S)

This application claims priority from U.S. Provisional Application No. 60/387,207, filed Jun. 7, 2002, which is incorporated by reference as if fully set forth.

FIELD OF INVENTION

The present invention generally relates to communication systems. More specifically, the invention relates to communication systems using multiple access air interfaces and direct conversion/modulation for multi-carrier processing.

BACKGROUND

A digital communication system typically transmits information or data using a continuous frequency carrier with modulation techniques that vary its amplitude, frequency or phase. After modulation, the signal is transmitted over a communication medium. The communication medium may be guided or unguided, comprising copper, optical fiber or air and is commonly referred to as the physical communication channel.

The information to be transmitted is input in the form of a bitstream which is mapped onto a predetermined constellation of symbols that defines the modulation scheme. The mapping of each bit as symbols is referred to as modulation.

A prior art base station is typically required to utilize multiple carriers converging continuous frequency spectrum. A block diagram of prior art superheterodyne receiver 11 which may be implemented in the base station is shown in FIG. 1. An operator is typically assigned two (2) or more channels Ch1–Ch4 (carriers), and desires to use them in each cell (frequency reuse=1). If this is not possible due to certain constraints which result in a frequency re-use factor that is lower, the operator has a finite number of channels, and will partition them in contiguous sections of spectrum so that a number of adjacent channels are used in each cell. In this case, the receiver 11 is required to process all channels (carriers) simultaneously. This minimizes hardware cost, size, and power consumption.

In the past, the high demanding requirements of base station receivers could only be met with a superhetrodyne architecture. The direct conversion architecture has many inherent problems that result from downconverting the RF signal directly to baseband. These problems include self-mixing which creates DC offsets in the baseband signal; even-order distortion which converts strong interfering signals to baseband; 1/f noise which is inherent in all semiconductor devices and which is inversely proportioned to the frequency (f) and which masks the baseband signal; and spurious emissions of the LO signal which interferes with other users. Direct conversion receivers also stress the state-of-the-art capabilities of the analog baseband processing components because gain control and filtering must all be done at baseband. This requires expensive amplifiers that possess high dynamic range and a wide bandwidth.

Conventional multi-carrier radios are based on a superheterodyne radio architecture that utilizes an intermediate frequency (IF) and direct digital sampling to block convert multiple carriers to and from baseband, as shown in FIG. 1 for the receiver. Because the IF is typically located above 50 MHz, direct digital sampling requires expensive high-speed or sub-sampling data converters, such as analog-to-digital converters (ADC) and digital-to-analog converters (DACs) capable of sampling rates greater than 100 MHz and requiring very low clock jitter.

Another disadvantage to direct digital sampling is the IF Surface Acoustic Wave (SAW) filters needed to reject interference in adjacent channels. The maximum number of carriers supported by the radio determines the bandwidth of the SAW filter. Support for a different number of carriers requires additional SAW filters. As an alternative, one IF filter can be used that covers the entire band of interest, but then additional dynamic range is needed in the ADC to handle the additional interference.

This can be understood from the dynamic range of the received signal. When the uplink channels are all under the control of the same base station, the radio frequency (RF) carriers will be received at similar power levels, requiring relatively less dynamic range in the ADC. However, if the IF filter bandwidth covers the entire band, uplink channels belonging to other base stations will be present at the input to the ADC. These channels can be at a very high level, thus requiring more dynamic range in the ADC.

Referring back to FIG. 1, the receiver 11 is used for digital multi-carrier wireless communication, for example a Code Division Multiple Access (CDMA) communication. As a signal is received at the antenna 15, it passes a first bandpass filter 16 and a linear amplifier 17. A second bandpass filter 18 receives the signal from the amplifier 17 and provides the signal to a mixer 19. A local oscillator 20 is connected to the mixer 19 and the mixer 19 translates the signal from RF to IF and is then filtered by a bandpass filter 21.

The bandpass filter 21 is connected to an ADC 22 which provides its digitized output to a digital downconverter 23. A complex numerically-controlled oscillator 24 is used to control the digital downconverter 23 to translate each channel at IF to baseband. The digital downconverter 23 provides quadrature baseband signals to a bank of finite impulse response (FIR) filters 25, which perform pulse shaping and interference rejection. The outputs from the FIR filters 25 are provided to respective digital automatic gain control circuits (DAGCs) 35 which provide outputs in four (4) respective channels 45. The digital data from each channel is sent to a digital processor (not shown) for further processing, such as data demodulation and decoding. Although four (4) channels are shown as an example, those of skill in the art would realize that there could be any number of channels.

A similar process is used on the transmission side, as shown in FIG. 2, which is a block diagram showing prior art transmitter 51 using four (4) input channels Ch1–Ch4 65. The four (4) input channels 65 are provided to respective power control circuits 75 which, in turn, provide their outputs to respective FIR filters 85. The FIR filters 85 are typically used for pulse shaping purposes. The outputs from the FIR filters 85 are provided in quadrature to a digital up converter 95, which is connected to a complex numerically-controlled oscillator 96. The output of the digital up converter 95 is provided to a digital-to-analog (DAC) circuit 97, which supplies its analog output to a first bandpass filter 98, which in turn is provided to an IF mixer 99. The IF mixer 99 receives its local oscillator signal from an oscillator 100 and provides an output to a second bandpass filter 102. The output bandpass filter is amplified at an amplifier 103, filtered at an output bandpass filter 104 and provided for transmission via antenna 105.

In these configurations (FIGS. 1 and 2), various conversions are performed with RF components. The manufacturing costs of these RF components is significant. Therefore, it would be advantageous to provide a circuit which avoids multiple RF conversions to the maximum extent practical. Additionally, a direct conversion design for a receiver and transmitter are desired.

The major problem with prior art direct conversion receivers is the generation of DC offsets at the output of the receiver. The major sources of DC offset are local oscillator self-mixing and second order intermodulation (IP2) of the mixer. DC offsets may be quite large, leading to saturation in the ADC and other performance problems in the receiver.

Solutions to the direct conversion problems have been understood for some time, but they were not practical or cost effective until recent technology developments made possible integrated solutions on monolithic RF integrated circuits (RFICs). These solutions to the problems include balanced (differential) structures that eliminate even-order distortion, SiGe semiconductor technology which exhibits low 1/f noise and excellent linearity, and harmonic mixing that eliminates self-mixing and LO spurious emissions. The move to wideband wireless technologies has also reduced the contribution of the 1/f noise to the overall noise floor of the direct conversion receiver. In addition, high-speed, high linearity amplifiers are now available to meet the analog baseband processing requirements.

However, there are still major problems with direct conversion receivers in the generation of DC offsets at the output of the receiver. The major sources of DC offset are LO self-mixing and second order intermodulation of the mixer. DC offsets may be quite large leading to saturation of the ADC and other performance problems in the receiver. Accordingly, although there have been advances with the prior art, these prior art techniques these still fall far short of the optimum performance.

SUMMARY

The present invention is a radio communication device, such as a receiver, transmitter or transceiver, that includes a direct conversion, multi-carrier processor. The multi-carrier processor frequency translates RF channels to and from baseband using a quadrative modulator (transmitter) or demodulator (receiver). Because the analog signals are translated close to DC, conventional adjustable filters may be programmed via a bandwith control unit to support different number of channels (carriers) and channel bandwidths.

DETAILED DESCRIPTION OF THE PREFERRED EMBODIMENTS

The present invention will be described with reference to the figures where like numerals represent like elements throughout.

This present invention enables block processing of multiple RF carriers in a wireless communication system using a direct conversion transmitter/receiver and baseband signal processing. Such a multi-carrier radio reduces cost by simultaneously processing multiple carriers within a single radio, rather than processing each carrier in separate radios.

Figure 1:
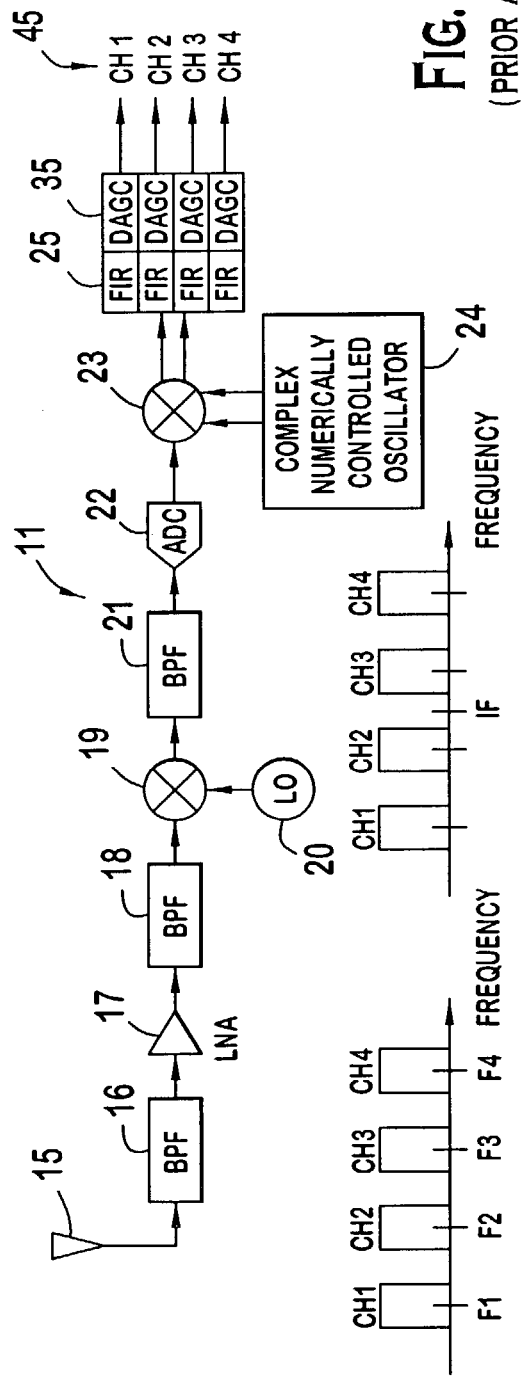
FIG. 1 is a block diagram of a prior art superhetrodyne with direct digital sampling multi-carrier receiver.
Figure 2:
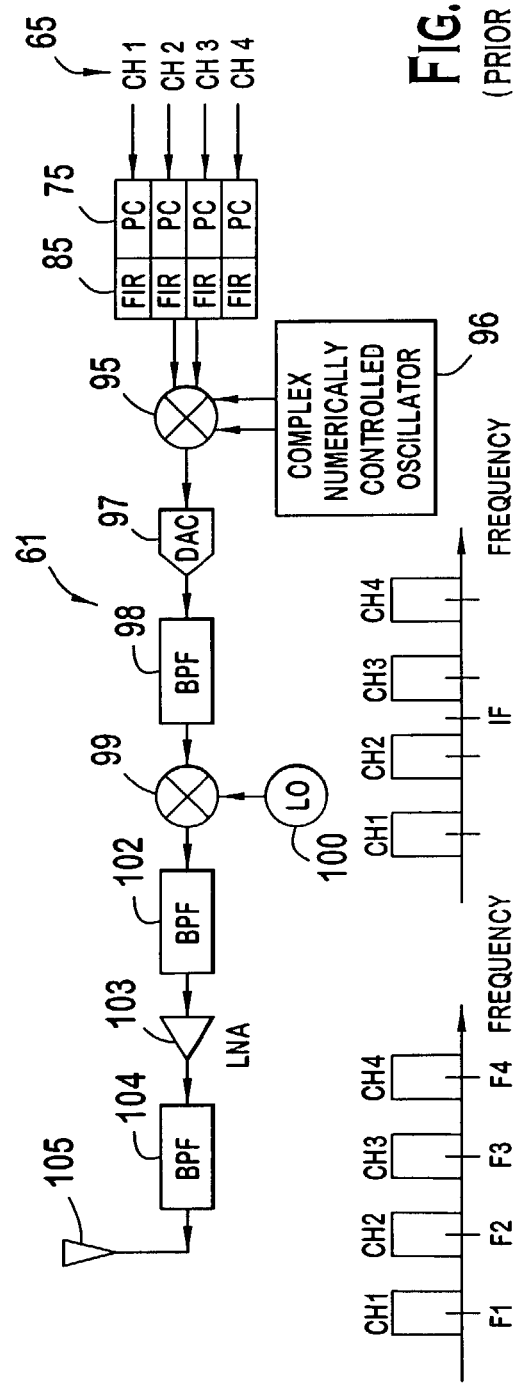
FIG. 2 is a block diagram of a prior art superhetrodyne with direct digital transmitter.
Figure 3:
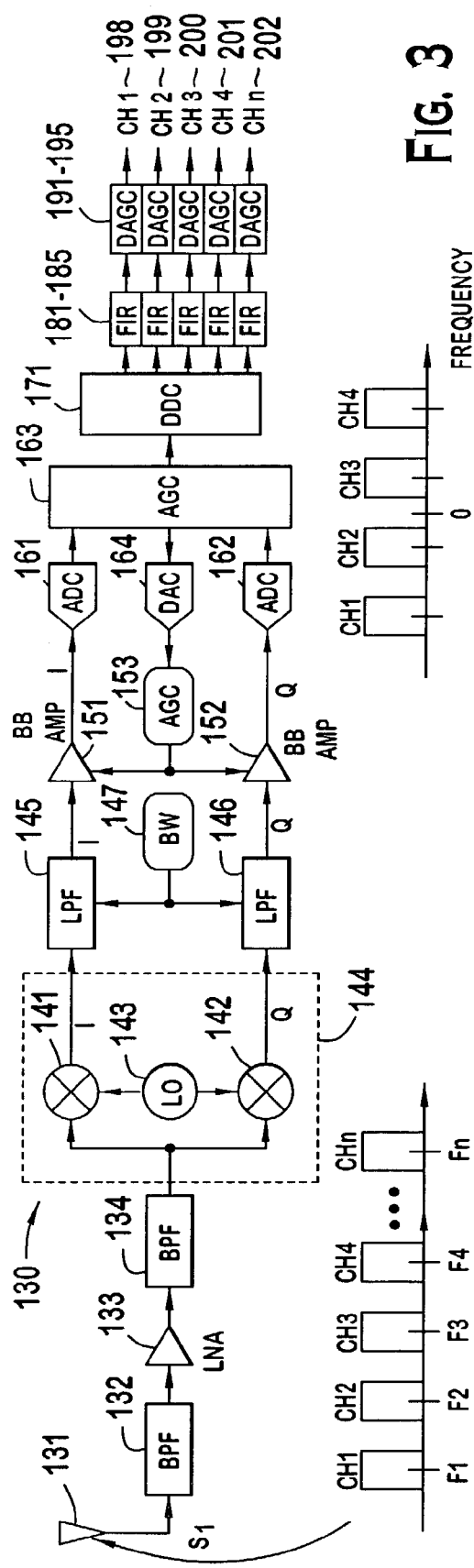
FIG. 3 is a block diagram of a direct conversion multi-carrier receiver made in accordance with the present invention.

FIG. 3 is a block diagram showing an exemplary embodiment of a communication receiver 130 constructed in accordance with the invention. The receiver 130 receives a plurality of communication signals $Ch_1$, $Ch_2$ ... $Ch_n$, each of which is sent over a carrier frequency $F_1$, $F_2$ ... $F_n$, respectively. These signals will be referred to collectively hereinafter as multi-carrier signal S1.

The receiver 130 has an antenna 131, a first bandpass filter 132, a radio frequency amplifier 133 and a second bandpass filter 134. Also included are first and second mixers 141, 142, connected to a local oscillator 143, first and second low pass filters (LPFs) 145, 146, a bandwidth control circuit 147 and first and second baseband amplifiers 151, 152. The first and second mixers 141, 142 coupled with the local oscillator 143 comprise a demodulator 144.

A first automatic gain control (AGC) circuit 153 is connected to the baseband amplifiers 151, 152, and the outputs from the baseband amplifiers 151, 152 are provided to ADC circuits 161, 162. The digitized outputs from the ADCs 161, 162 are provided to a second AGC circuit 163. The second AGC circuit 163 provides an AGC output to a DAC 164, which in turn provides an input to the first AGC circuit 153, thereby controlling the gain of baseband amplifiers 151, 152.

The output from the second AGC circuit 163 is provided to a digital downconverter 171, which provides separate outputs to a plurality FIR filters 181–185, and in turn to a plurality DAGCs 191–195 to provide outputs to a plurality of channels $Ch_1$–$Ch_n$ 198–202. The use of the digital-analog AGC loop 163, 164, 153 reduces the dynamic range at the output and therefore reduces the requisite dynamic range of digital AGC circuits 191–194 downstream.

The antenna 131 captures the multi-carrier signal S1 and inputs the signal S1 to bandpass filter 132, which provides band filtering to reject out-of-band interference. After filtering, the signal is input to the low noise amplifier (LNA) 133 which sets the noise floor of the receiver 130. The output of the LNA 133 is filtered through bandpass filter (BPF) 134 to filter any intermodulation distortion produced by the LNA 133.

The output of the LNA 133 is sent to the demodulator 144, which consists of mixers 141 and 142 and the stable local oscillator (LO) 143. The LO 143 has two outputs, one in-phase (I) and one in quadrature (Q), relative to the carrier. The frequency of the LO 143 is the center frequency of the input channels $Ch_1$–$Ch_n$, $(F_1-F_n)/2$; where $F_1$ is the carrier frequency of the first channel $Ch_1$ and $F_n$ is the carrier frequency of the nth channel $Ch_n$. The demodulator 144 translates the desired signal from RF to baseband, centering the signal around DC.

The I and Q signals are sent to LPFs 145 and 146, which provide interference rejection in order to minimize the dynamic range of the downstream baseband processing elements 151–194. Since the analog signals are translated close to DC, conventional adjustable filters 145 and 146 may be programmed via bandwith control 147 to support different number of channels and channel bandwidths.

ADCs 161, 162 are pair of conventional low cost ADCs which digitize the I/Q signals from the demodulator 144. The individual channels $Ch_1$–$Ch_n$ are down-converted to baseband by the DDC 171.

Channel filtering and pulse shaping is applied to each channel $Ch_1$–$Ch_n$ by the FIR filters 181–185.

The AGC process is performed in two steps. The first step is performed in the first and second AGC circuits 153, 163 to adjust the gain of the baseband amplifiers 151, 152 to maintain the signal within the dynamic range of the ADCs 161, 162. The second step of the AGC process is performed digitally in the DAGC block 191 195 and is used to reduce the bitwidth of the I/Q signals to the minimum required for each channel 198–202.

As shown in FIG. 3, the receiver 130 operates as a multi-carrier direct conversion receiver. The frequency block containing the multiple RF channels is thereby down-converted directly to baseband as a block of frequencies.

Figure 4:
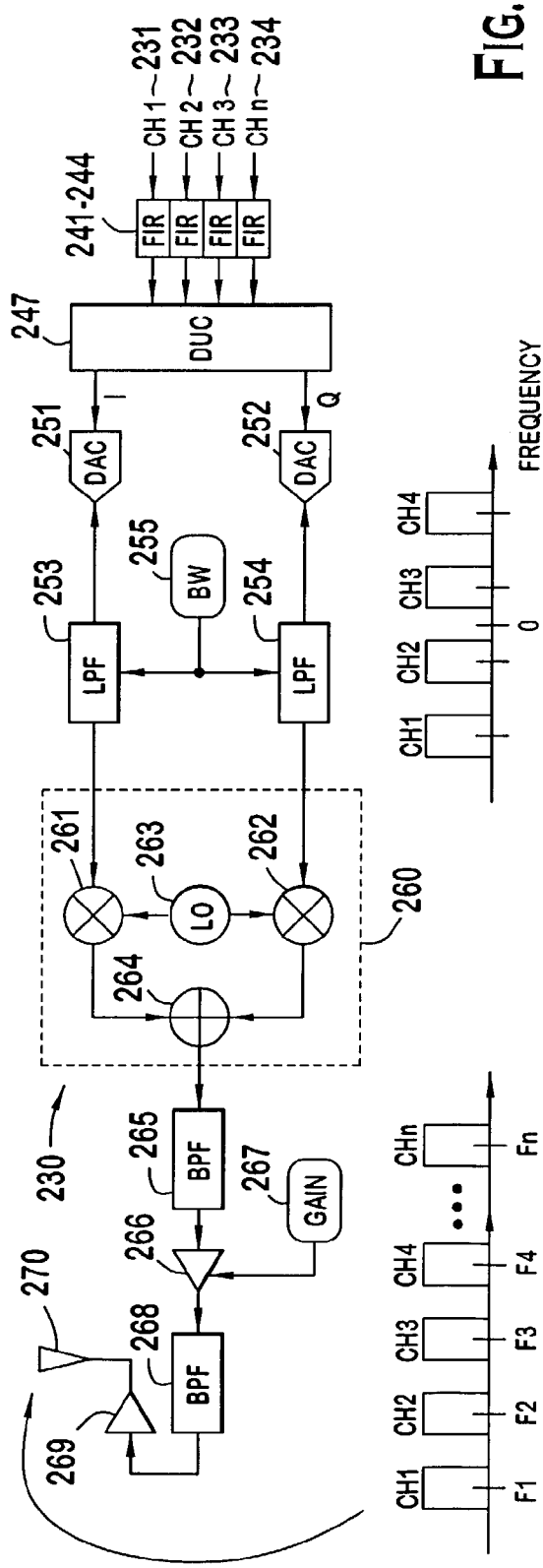
FIG. 4 is a block diagram of a direct conversion multi-carrier transmitter made in accordance with the present invention.

FIG. 4 is a block diagram showing an exemplary embodiment of a direct conversion communication transmitter 230 constructed in accordance with the invention. The individual channels ($Ch_1$–$Ch_n$) 231–234 are first sent through FIR filters 241–244 and are digitally upconverted by a digital upconverter DUC 247. This provides a digital baseband signal, which is used to drive a pair of low cost DACs 251, 252. The DUC 247 converts an input signal into I/Q signal components by shifting the center frequency from zero to +/− one half of the bandwidth.

The output of the DUC 247, comprises two digital outputs which are separated in quadrature. These I/Q outputs are input to the DACs 251 and 252, which convert the digital signals to analog. The analog outputs from DACs 251, 252 are provided to LPFs 253, 254, the bandwidth of which are controlled by bandwidth control circuit 255. The LPFs 253, 254 filter the analog signals and provide their respective filtered outputs to a modulator 260, comprising two mixers 261, 262, the LO 263 and the summer 264. The mixers 261, 262 are controlled by the LO 263 and provide mixed outputs to the summer 264. The modulator 260 provides an output to the bandpass filter 265 and, in turn, to a first RF amplifier 266. The RF amplifier 266 is controlled by gain control circuit 267 and provides an output to bandpass filter 268 and RF power amplifier 269 which amplifies the signal for transmission, via antenna 270.

As can be clearly seen in FIGS. 3 and 4, the direct conversion multi-carrier processor in accordance with the present invention avoids the disadvantages of the superheterodyne radio by eliminating the IF stage. This reduces cost in the radio and allows the data converters to operate at baseband at a lower clock rate, which further reduces cost. Adjustable bandwidth filters are readily realizable at baseband, allowing flexible support for variable carrier spacing and the number of carriers to be processed in the radio. This also reduces the dynamic range required in the ADC because only the desired carriers are present at the ADC, again reducing cost.

The present invention is applicable to wireless communication systems, including wireless local loop, wireless LAN applications, and cellular systems such as WCDMA (both UTRATDD and UTRAFDD), TDSCDMA, CDMA2000, 3xRT, and OFDMA systems.

While the present invention has been described in terms of the preferred embodiment, other variations, which are within the scope of the invention as outlined in the claims below will be apparent to those skilled in the art.

What is claimed:

1. A multi-carrier direct conversion receiver for receiving and processing a multi-carrier radio frequency (RF) signal, comprising:

an antenna for receiving the multi-carrier RF signal;

an RF amplifier which provides an interface between the antenna and a demodulator, the RF amplifier configured to amplify the received multi-carrier RF signal;

the demodulator coupled to the RF amplifier and configured to convert the multi-carrier RF signal into in-phase (I) and quadrature (Q) baseband signals;

first and second baseband stages, each stage comprising a low pass filter and amplifier, and the first stage configured to process the I baseband signal and the second stage configured to process the Q baseband signal;

first and second analog to digital converters, the first converter configured to convert the I baseband signal to a digital I signal, and the second converter configured to convert the Q baseband signal to a digital Q signal; and a direct conversion circuit, connected to the analog to digital converters, for converting the digital I and Q signals into a plurality of channel signals.

2. The receiver of claim 1, further comprising a plurality of finite impulse response (FIR) filters, each of the plurality of filters configured to filter a respective one of said plurality of channel signals.

3. The receiver of claim 1, wherein the bandwidth of each of the low pass filters is adjustable.

4. The receiver of claim 3, further comprising a bandwidth control circuit for controlling the bandwidth of the low pass filters.

5. A multi-carrier direct modulation transmitter for processing and transmitting a plurality of channel signals, the transmitter comprising:

a digital up converter configured to receive said plurality of channel signals and to output a digital in-phase (I) signal corresponding to said plurality of channel signals and a digital quadrature (Q) signal corresponding to said plurality of channel signals;

first and second digital to analog converters, the first converter configured to convert said digital I signal to an I analog signal at a baseband frequency and the second converter configured to convert said digital Q signal to a Q analog signal at a baseband frequency;

a modulator configured to modulate said analog baseband I and Q signals to provide a combined radio frequency (RF) signal; and a transmitting device configured to transmit said RF signal.

6. The transmitter of claim 5, further comprising an RF amplifier, for amplifying said RF signal prior to transmission.

7. The transmitter of claim 6, further comprising first and second low pass filters, said first filter coupled to said first digital-to-analog converter and configured to filter said analog I signal and said second filter coupled to said second digital-to-analog converter and configured to filter said analog Q signal.

8. The transmitter of claim 7, further including a bandwidth control circuit for controlling the frequency response of the transmitter by controlling the bandwidth of said low pass filters.

9. The transmitter of claim 8, further comprising a plurality of finite impulse response (FIR) filters, each FIR filter configured to receive one of said plurality of channel signals and to provide a filtered output of a respective channel signal to the digital up converter.

10. The transmitter of claim 8, further comprising a plurality of finite impulse response (FIR) filters, each FIR filter configured to receive one of said plurality of channel signals and to provide a filtered output of a respective channel signal to the digital up converter.

11. The transmitter of claim 5 further comprising first and second low pass filters, said first filter coupled to said first digital-to-analog converter and configured to filter said analog I signal and said second filter coupled to said second digital-to-analog converter and configured to filter said analog Q signal.

12. The transmitter of claim 11, further including a bandwidth control circuit for controlling the frequency response of the transmitter by controlling the bandwidth of said low pass filters.

* * * * *

UNITED STATES PATENT AND TRADEMARK OFFICE
CERTIFICATE OF CORRECTION

| | |
|---|---|
| PATENT NO. | : 7,162,218 B2 |
| APPLICATION NO. | : 10/456300 |
| DATED | : January 9, 2007 |
| INVENTOR(S) | : Anxess et al. |

It is certified that error appears in the above-identified patent and that said Letters Patent is hereby corrected as shown below:

At column 1, line 34, after the word "carriers", delete "converging continuous" and insert therefor --using a converging contiguous--.

At column 1, line 48, after the words "with a", delete "superhetrodyne" and insert therefor --superheterodyne--..

At column 1, line 55, after the word "inversely", delete "proportioned" and insert therefor --proportional --.

At column 3, line 37, after the word "techniques", delete --these--.

At column 3, line 57, after the word "art", delete "superhetrodyne", and insert therefor --superheterodyne--.

At column 3, line 59, after the word "art", delete "superhetrodyne" and insert therefor --superheterodyne--.

At column 4, line 39, after the word "plurality", insert --of--.

At column 4, line 40, after the word "plurality", insert --of--.

At column 4, line 66, after the word "elements", delete "151-194" and insert therefor --191-195--.

At column 5, line 3, before the word "pair", insert --a--.

UNITED STATES PATENT AND TRADEMARK OFFICE
CERTIFICATE OF CORRECTION

PATENT NO. : 7,162,218 B2
APPLICATION NO. : 10/456300
DATED : January 9, 2007
INVENTOR(S) : Anxess et al.

It is certified that error appears in the above-identified patent and that said Letters Patent is hereby corrected as shown below:

At column 5, line 14, after the word "block", delete "191 195", and insert therefor --191-195--.

Signed and Sealed this

Seventeenth Day of April, 2007

JON W. DUDAS
*Director of the United States Patent and Trademark Office*